United States Patent [19]

Mihara

[11] Patent Number: 4,608,584
[45] Date of Patent: Aug. 26, 1986

[54] VERTICAL TYPE MOS TRANSISTOR

[75] Inventor: Teruyoshi Mihara, Yokosuka, Japan

[73] Assignee: Nissan Motor Co., Ltd., Yokohama, Japan

[21] Appl. No.: 620,290

[22] Filed: Jun. 13, 1984

[30] Foreign Application Priority Data

Jun. 13, 1983 [JP] Japan .............................. 58-105544

[51] Int. Cl.[4] ........................................... H01L 29/78
[52] U.S. Cl. ............................. 357/23.4; 357/23.11; 357/55
[58] Field of Search ...................... 357/23.4, 23.11, 55

[56] References Cited

U.S. PATENT DOCUMENTS 4,296,429 10/1981 Schroeder ............................ 357/55
4,329,705 5/1982 Baker ................................... 357/23.4
4,455,740 6/1984 Iwai ..................................... 357/23.4

OTHER PUBLICATIONS

Blicher, Adolph, Field-Effect and Bipolar Power Transistor Physics, Academic Press, New York, 1981, pp. 280-283.

Primary Examiner—Martin H. Edlow
Attorney, Agent, or Firm—Schwartz, Jeffery, Schwaab, Mack, Blumenthal & Evans

[57] ABSTRACT

The vertical type MOS transistor includes a transistor body region which consists of an N+ type (high concentration N type) substrate having a drain electrode connected on its bottom surface, and an N− type (low concentration N type) layer epitaxially grown on the top surface of the substrate, and a plurality of P type well regions formed with a prescribed interval on the top surface of the N− type layer. Within a P type well region, there are provided N+ type source regions, and an oxidized gate region and a gate electrode that bestride over both of an N+ source region and the N− type drain region which is to function as the effective drain region.

There are provided stopper grooves of dug-out form, situated between and at equal distances from the adjacent P type well regions, extending downward from the surface of the N− type drain region parallel to the sides of the P type well regions.

3 Claims, 14 Drawing Figures

VERTICAL TYPE MOS TRANSISTOR

BACKGROUND OF THE INVENTION

1. Field of the Invention

The present invention relates to a vertical type MOS transistor with stable performance characteristics.

2. Description of the Prior Art

Referring to FIG. 1, there is shown a conventional vertical type MOS transistor. (Taken from "Field-Effect and Bipolar Power Transistor Physics," published by Academic Press in 1981, pp. 280–282.)

The vertical type MOS transistor shown in the figure includes a transistor body region which consists of an N+ type (high concentration N type) substrate 1 having a drain electrode connected on its bottom surface, and an N− type (low concentration N type) layer 2 epitaxially grown on the top surface of the substrate 1, and a plurality of P type well regions 3 formed with a prescribed interval on the top surface of the N− type layer (referred to as the N− type drain region hereinafter) 2. Within a P type well region 3, there are provided N+ type source regions 4, and an oxidized gate region 5 and a gate electrode 6 that bestride over both of an N+ source region 4 and the N− type drain region 2 which is to function as the effective drain region.

The top surface of a gate electrode 6 is covered by a PSG layer 7, and a source electrode 8 is formed so as to cover the top surface of the PSG layer 7 and to make direct contact with the N+ type source region 4 and a P+ type contact region 9 that is formed within the P type well region 3.

The breakdown voltage between the source and the drain of this kind of vertical type MOS transistor is determined by the breakdown voltage of the joined section of the N− type drain region 2 and P type well region 3. In other words, the higher the impurity concentration of the N− type drain region 2, the lower is the breakdown voltage between the source and the drain, which results in a decrease in the on-state resistance.

Moreover, since the threshold voltage Vt is determined by the maximum concentration Po at the surface of the P type well region 3, when it is arranged to have both of the breakdown voltage and the threshold voltage to be relatively low, the difference between the impurity concentrations of the N− type drain region 2 and the P type well region 3 becomes small.

Under these circumstances, when the threshold voltage Vt or the on-state resistance, of a conventional MOS transistor with the above construction, is desired to be low, the depletion layer Dp which develops upon impression of a voltage between the source and the drain spreads with approximately equal widths on the side of the N− type drain region 2 as well as on the side of the P type well region 3, as shown by the broken lines in FIG. 1. Therefore, when the width of the depletion layer Dp increases, the effective length Le of the channel is diminished (the so-called short channel effect), resulting in changes in the performance characteristics or giving rise to a possibility of causing punch-through due to reach of the depletion layer Dp to the N+ tye source region 4.

SUMMARY OF THE INVENTION

It is an object of the present invention, to provide a vertical type MOS transistor which allows for the further reduction of the on-state resistance, the threshold voltage, and the breakdown voltage.

It is another object of the present invention to provide a vertical type MOS transistor which makes it possible to prevent the punch-through and the short channel effect by restricting the growth of the depletion layer.

It is a further object of the present invention to provide a fabricating method for manufacturing vertical type MOS transistor with high accuracy and stable performance characteristics.

It is a still further object of the present invention to improve the operating efficiency in the manufature of the vertical type MOS transistors.

Briefly described, these and other objects of the present invention are accomplished by the provision of an improved MOS transistor of vertical type comprising, a semiconductor substrate of first conductivity type, a well region of second conductivity type formed above the top surface of the semiconductor substrate, a region of first conductivity type formed within the well region, and a MOS type gate electrode formed in such a manner as to bestride at least a portion of a top surface of the semiconductor substrate adjacent to the well region and the top surface of the periphery of said region.

The semiconductor substrate has a stopper groove extending downward from the top surface of the semiconductor substrate adjacent to the well region.

BRIEF DESCRIPTION OF THE DRAWING

These and other objects, features, and advantages of the present invention will be more apparent from the following description of a preferred embodiment, taken in conjunction with the accompanying drawings, in which.

DESCRIPTION OF THE PREFERRED EMBODIMENTS

Figure 1:
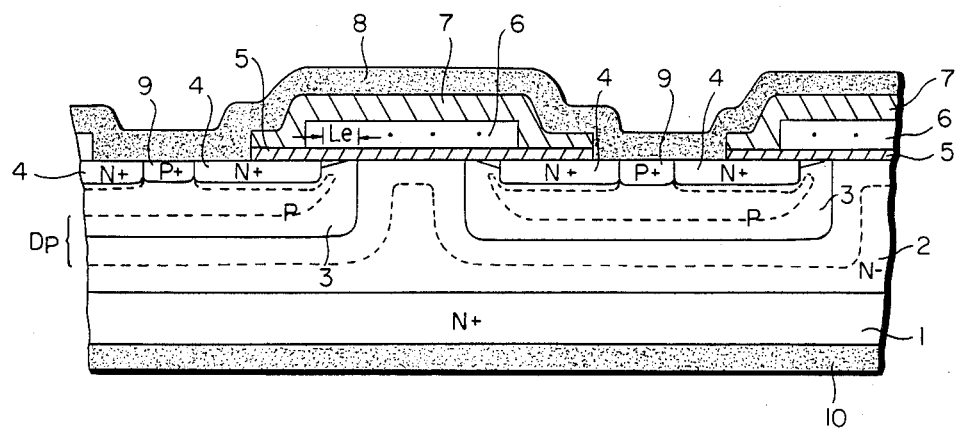
FIG. 1 is a cross section view of a conventional vertical type MOS transistor.
Figure 2:
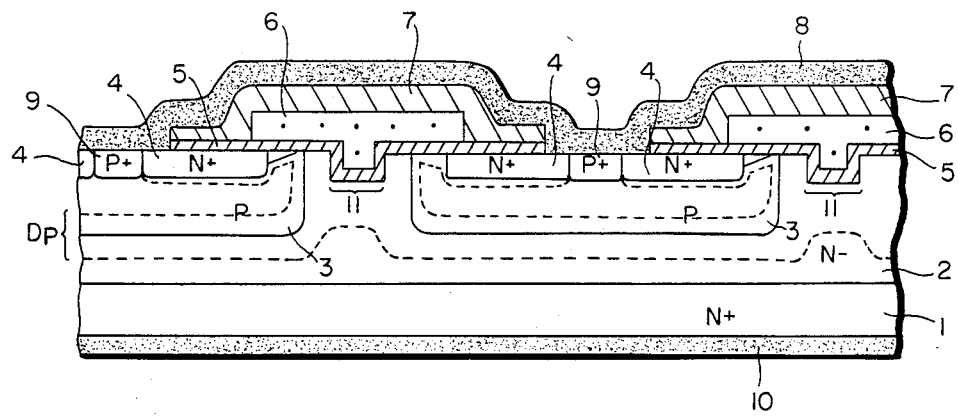
FIG. 2 is a cross section view of one embodiment of the vertical type MOS transistor in accordance with the present invention.

Referring now to FIG. 2, there is shown an embodiment of the vertical type MOS transistor in accordance with the present invention. In the figure, the same constituent parts as in the example of the conventional system shown in FIG. 1 are labeled with the same reference numerals, omitting the explanation thereof.

As shown in FIG. 2, in this embodiment of the vertical type MOS transistor, in addition to the construction for a conventional system shown in FIG. 1, there are provided stopper grooves 11 of dug-out form, situated between and at equal distances from the adjacent P type well regions 3, extending downward with respect to the surface of the N− type drain region 2 and in parallel to the sides of the P type well regions 3.

Through the intermediary of an oxidized gate layer 5, a portion of the bottom side of a gate electrode 6 is embedded into the stopper groove 11.

Figure 3:
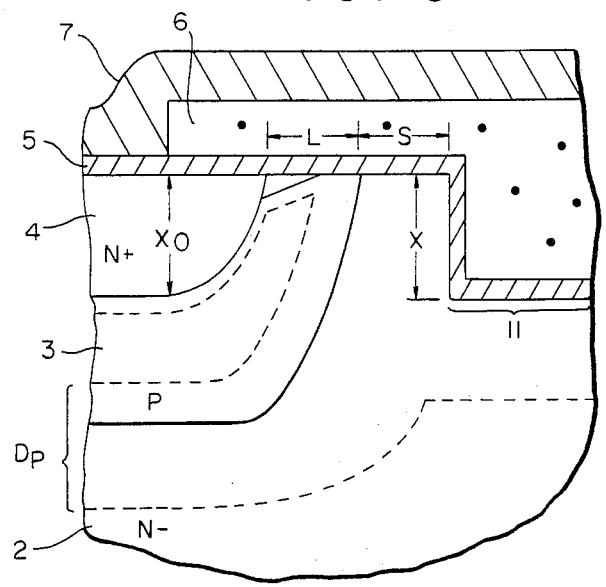
FIG. 3 is an enlarged cross section view of the principal part of the vertical type MOS transistor shown in FIG. 2.

In a vertical type MOS transistor of the above construction, when the threshold voltage Vt is made low by decreasing the impurity concentration of the P type well regions 3 and the breakdown voltage and the on-state resistance are made low by increasing the impurity concentration in the vicinity of the surface of the $N^-$ type drain region 2, the depletion layer Dp spreads, as shown in FIG. 3 by broken line, with roughly equal widths into both of the side of the P type well region 3 and the side of the $N^-$ type drain region 2.

As the drain voltage is further increased, the width of the depletion layer increases accordingly. However, in this embodiment of the MOS transistor, the amount of the electric charge in the depletion layer at the surface of the $N^-$ type drain region 2 is less than the corresponding quantity for the case of a conventional system shown in FIG. 1, due to provision of the stopper groove 11 at the surface of the $N^-$ type drain region 2, so that it becomes possible to suppress the growth of the depletion layer at the surface of the $N^-$ type drain region 2.

Accordingly, the growth in width of the depletion layer Dp at the surface of the p type well region 3 does not process beyond the width of the depletion layer Dp on the side of the $N^-$ type drain region which the layer had at the time when it reached the stopper groove 11. Therefore, increasing the drain voltage thereafter does not result in the occurrence of a punch-through or the short channel effect.

The separation S between the stopper groove 11 and the side surface of the P type well region 3 is set up to satisfy aproximately the relation $LNp > SNn$, where L is the effective channel length, Nn the average concentration of the $N^-$ type drain region 2 in the vicinity of its surface, and Np the average concentration of the P type well region 3 in the vicinity of its surface. By this arrangement, the depletion layer Dp reaches the stopper groove 11 on the side of the $N^-$ type drain region 2 before a punch-through occurs in the P type well region 3, and grows thereafter down below the stopper groove 11, easing the surface electric field. Here, prevention of a punch-through can be guaranteed by arranging the depth X of the stopper groove 11 to be equal to or greater than the diffusion depth X of the $N^+$ type source region 4. The reason for this being that if $X < XO$, the depletion layer Dp grows conspicuously, outside of the region of the stopper groove 11, into the side of the P type well region 3 to each the $N^+$ type source region, creating the possibility for occurrence of a punch-through.

As explained in the foregoing, with the provision of the stopper groove 11, it becomes possible to prevent the occurrence of the short channel effect or a punch-through by restricting the growth of the width of the depletion layer to within a fixed value. Consequently, it becomes possible to decrease the on-state resistance by increasing the impurity concentration of the $N^-$ type drain region 2 and also to lower the threshold voltage Vt by decreasing the impurity concentration of the P type well region 3, without paying any attention to the effect of the depletion layer.

An example of the fabricating process of the vertical type MOS transistor of above description will now be illustrated briefly by referring to the process charts, FIGS. 4a-4k.

Figure 4A:
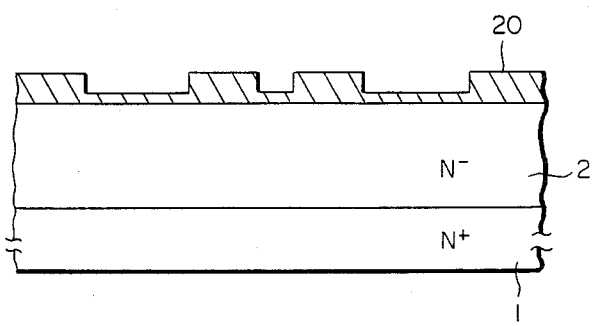
FIGS. 4a–4k are the precess charts illustrating an example of the manufacturing method of vertical type MOS transistors.

First, as shown in FIG. 4a, an $N^-$ type drain region 2 is grown epitaxially on top of an $N^+$ type substrate. A layer 20 of $SiO_2$ which is to become the diffusion mask is grown (to 5000 Å) on the surface of the $N^-$ drain region 2, and a light oxidation (to 1000 Å) is carried out subsequent to photoetching of the prescribed parts (sections for the wells and the grooves).

Figure 4B:
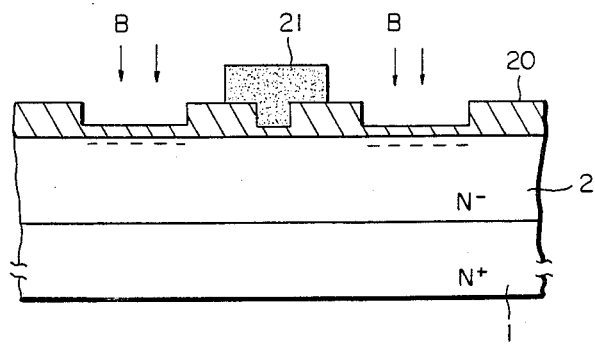

Next, as shown in FIG. 4b, photoresist 21 is placed covering the area other than that for the wells, and boron (B) ions are implanted to the surface of the $N^-$ type drain region 2.

Figure 4C:
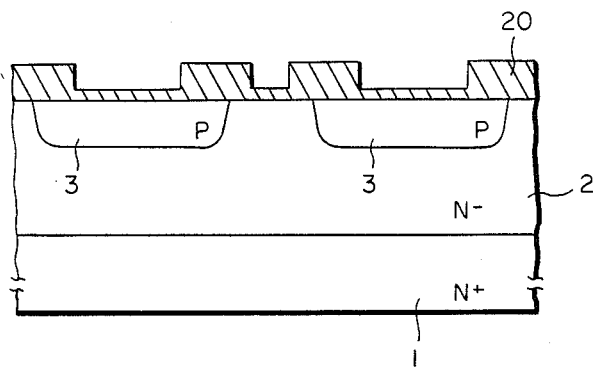

As shown in FIG. 4c, P type well regions 3 are formed by allowing the boron ions implanted as above to diffuse out for a prescribed length of time (at 1150° C., in $N_2$ gas).

Figure 4D:
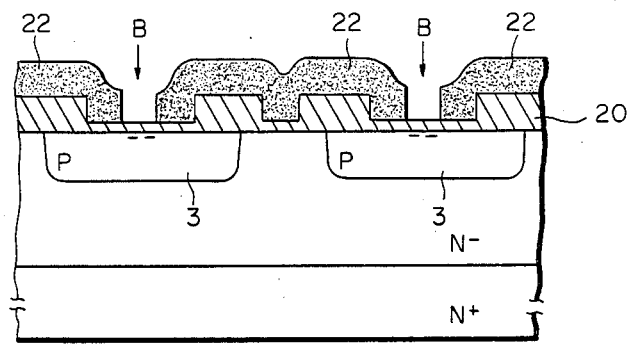
Figure 4E:
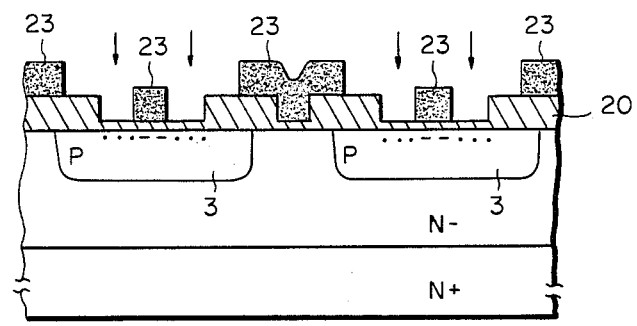

As shown in FIG. 4d, photoresist 22 is laid over the surface save the parts for the well contact regions, and boron ions are implanted in the areas for the well contact regions.

As shown in 4e, photoresist 23 is laid over the surface save the parts for the source regions, and phosphorus (P) ions are implanted to the areas for the source regions.

Figure 4F:
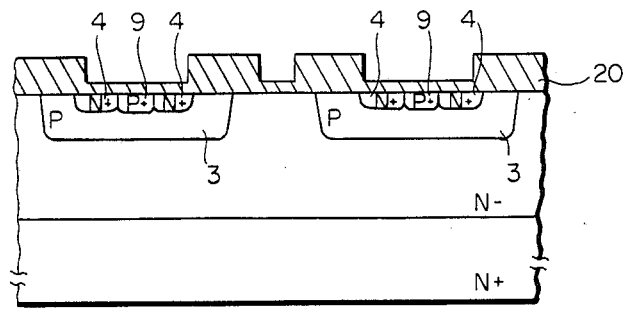

As shown in FIG. 4f, $N^+$ source regions 4 and well contact regions 9 are formed by allowing the boron ions and phosphorus ions implanted as above to diffuse out for a prescribed length of time (at 1100° C., in $N_2$ gas).

Figure 4G:
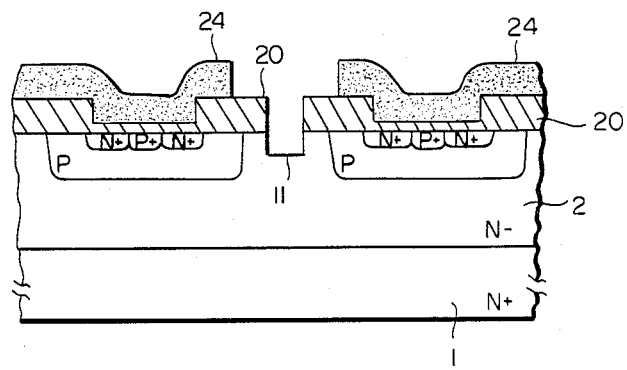

Next, as shown in FIG. 4g, photoresist 24 is laid over the surface save the parts for the stopper grooves, and after removal of the light oxidized layer from the areas for the stopper grooves, the surface of the $N^-$ type drain region 2 is etched out with the $SiO_2$ layer 20 as a mask, to form the stopper grooves 11.

Figure 4H:
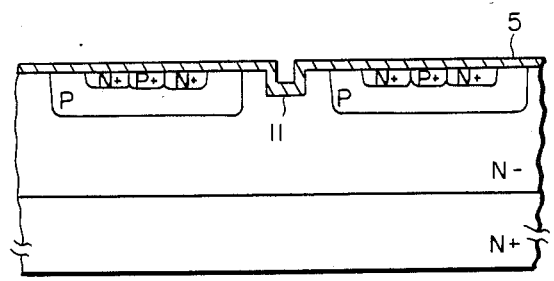

Next, the $SiO_2$ layer 20 is removed, and then, as shown in FIG. 4h, an oxidized gate layer ($SiO_2$) 5 is grown (to 1060 Å, in dry $O_2$ gas) over the entire surface of the device.

Figure 4I:
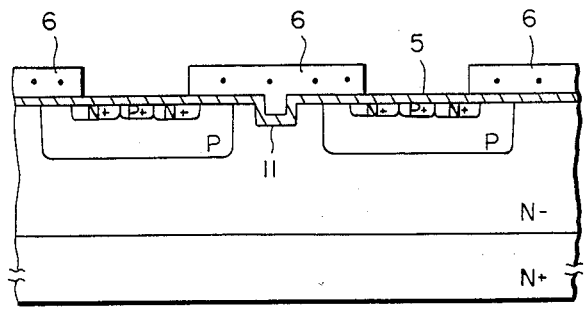

Next, as shown in FIG. 4i, after growing polysilicon over the device surface, the gate electrodes 6 are formed (CVD under reduced pressure, to 6000 Å) by photoetching techniques using a mask with prescribed patern.

Figure 4J:
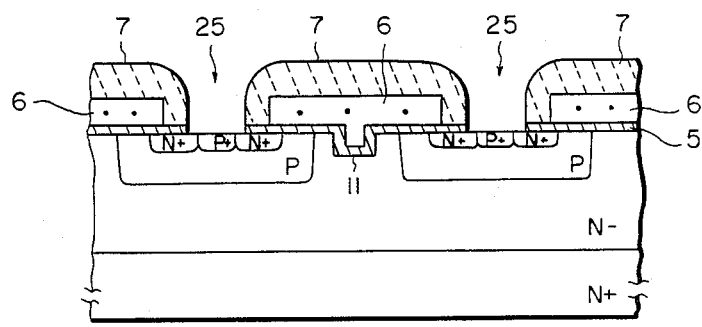

Next, as shown in FIG. 4j, after growing an insulating layer (CVD, to 7000 Å) of PSG or the like all over the device surface, there are formed contact holes 25.

Figure 4K:
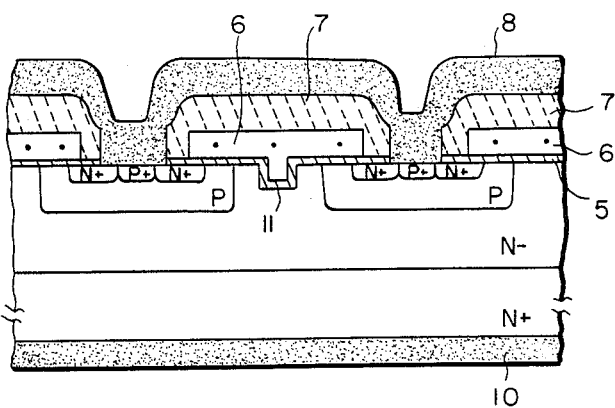

Finally, as shown in FIG. 4k, the source electrodes 8 is formed by sputtering aluminum (to 2 μm) over the top surface of the device, and the drain electrode 10 is formed by sputtering aluminum (to 2 μm) over the bottom surface of the device, to complete the manufacture of the vertical type MOS transistor of the present embodiment.

In the manufacturing method described in the foregoing, in contrast to the cases where there are utilized separate masks, there exists no possibility of having slips in the locations of the P type well regions 3, the $N^+$ type source regions 4, and the stopper grooves 11, since they are formed in a self-aligned fashion by the use of one and the same mask 20, so that the errors in the separation S between the stopper groove 11 and the P type well region 3 decrease, making it possible to improve the operational efficiency of the manufacturing method.

In summary, in the embodiment of the vertical type MOS transistor in accordance with the present invention, it is possible to prevent the occurrence of punch-throughs and the short channel effect by restricting the growth of the depletion layer through the provision of the stopper grooves 11.

It becomes then possible to decrease further the on-state resistance, the threshold voltage, the breakdown voltage, and the like.

Vorious modifications will become possible for those skilled in the art after receiving the teachings of the present disclosure without departing from the scope thereof.

What is claimed is:

1. A vertical type MOS transistor comprising:

a semiconductor substrate of a first conductivity type;

an upper region formed on the upper surface of the substrate in which are formed a source region of the first conductivity type, a well region of the second conductivity type opposite to the first conductivity type and a drain region of the first conductivity type, said source region, well region and drain region having portions thereof lying along a flat top surface of the upper region, the well region having a side perpendicular to said top surface and forming a channel region between the source and drain regions;

a stopper groove formed in the drain region spaced from and having no portion thereof in contact with the well region so that the flat top surface is interrupted by the groove;

a source electrode electrically connected to the source region;

a gate electrode formed on the channel region through an insulator film; and a drain electrode formed on the lower surface of the substrate.

2. A vertical type MOS transistor as claimed in claim 1, in which said stopper groove extends downward from said top surface of said upper region parallel to the side of said well region.

3. A vertical type MOS transistor as claimed in claim 1, in which a portion of the bottom side of a gate electrode is embedded into the stopper groove through the intermediary of an oxidized gate layer.

* * * * *